(12) United States Patent
Tiwari et al.

(10) Patent No.: US 6,534,819 B2
(45) Date of Patent: Mar. 18, 2003

(54) DENSE BACKPLANE CELL FOR CONFIGURABLE LOGIC

(75) Inventors: Sandip Tiwari, Ithaca, NY (US); Arvind Kumar, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/943,210

(22) Filed: Aug. 30, 2001

(65) Prior Publication Data

US 2002/0043693 A1 Apr. 18, 2002

Related U.S. Application Data

(60) Provisional application No. 60/229,193, filed on Aug. 30, 2000.

(51) Int. Cl.[7] ............................................. H01L 29/76
(52) U.S. Cl. .................... 257/314; 257/903; 257/391; 257/392
(58) Field of Search ................... 257/314, 903; 365/182

(56) References Cited

U.S. PATENT DOCUMENTS

| | | | |
|---|---|---|---|
| 5,374,564 A | 12/1994 | Bruel | 437/24 |
| 5,437,762 A | 8/1995 | Ochia et al. | 216/20 |
| 5,712,208 A | 1/1998 | Tseng et al. | 438/770 |
| 5,726,087 A | 3/1998 | Tseng et al. | 438/261 |
| 5,909,627 A | 6/1999 | Egloff | 438/406 |
| 6,063,686 A | 5/2000 | Masuda et al. | 438/406 |
| 6,088,260 A * | 7/2000 | Choi | 365/182 |
| 6,103,599 A | 8/2000 | Henley et al. | 438/459 |
| 6,133,602 A * | 10/2000 | Shrivastava et al. | 257/314 |
| 6,248,626 B1 | 6/2001 | Kumar et al. | 438/257 |
| 6,351,176 B1 * | 2/2002 | Houston | 327/534 |

* cited by examiner

Primary Examiner—David Nelms
Assistant Examiner—Tu-Tu Ho

(57) ABSTRACT

A two transistor programmable logic cell 100 is used in programmable logic devices. The cell 100 has a backgate 3 that holds charge to program one of the two transistors into a logic 1 or a logic 0 state. Programmable logic devices are scalable to fine geometries and high densities and may be programmed to perform multiple logic functions on the same substrate.

13 Claims, 4 Drawing Sheets

DENSE BACKPLANE CELL FOR CONFIGURABLE LOGIC

CROSS-REFERENCE TO RELATED APPLICATIONS

This application claims the benefit of U.S. Provisional Patent Application Serial No. 60/229,193, filed Aug. 30, 2000.

BACKGROUND

A widely used class of semiconductor integrated circuits include configurable circuits such as field programmable gate arrays, complex programmable logic devices, etc. These are gate arrays that can be configured electronically in order to achieve one or more desired logic functions. The architecture, based on the size of blocks and their partitioning, allows implementations that vary in speed, density, power and functionality. These configurable arrays can quicky implement complex logic designs that are required for computers, networks, and other complex electronic devices and systems. One example of a configurable logic array is found in U.S. Pat. No. 6,063,686, whose disclosure is incorporated by reference. Configurable logic devices often substitute for more expensive custom logic devices and application specific integrated circuits. Configurable logic and memory devices often included excess or unused cells. Those extra or unused cells have been the basis of work that allows defect-tolerant computing and dynamic reconfigurability.

Most common implementations suffer from the need of a large number of devices to implement simple programmable functions. This invention describes a cell structure that is denser by as much as a factor of 10 compared to the SRAM-based structures. The dense structure allows scaling to significantly smaller dimensions in feature size, allows for a common technology for logic and memory structure, is non-volatile, scales to smaller dimensions than conventional logic cells, and provides a path through which semiconductor nanostructures could be implemented with defect tolerance and configurability. Dense memory structures are possible with backgate techniques. See U.S. Pat. No. 6,248,626 whose entire disclosure is incorporated by reference thereto. However, such techniques have not been applied to programmable logic devices.

SUMMARY

The invention provides a programmable logic integrated circuit with a plurality of programmable logic cells. Each programmable logic cell has a support substrate covered with a first insulating layer and a backgate on the first insulating layer. The backgate is conductive and may be either doped polysilicon or a suitable metal. A second insulating layer covers the backgate and insulates it from a superior device layer. The device layer is a layer of monocrystalline semiconductor material, such as silicon. In each cell there are two transistors. One transistor provides access to the other transistor. The other transistor is programmed by storing charge on the backgate.

The programmable logic integrated circuit may be combined with memory cells of similar structure. The programmed cells are non-volatile and retain their programmed states, on or off, without external power. The integrated circuit may include a plurality of surplus logic cells so that the integrated circuit can use one or more of the surplus cells if one or more of the used cells becomes defective or inoperative.

The architecture of the circuit includes programming lines coupled to programming transistors and to the gates of the transistor cells. The backgate extends beneath the respective channels of the transistors or each cell.

The invention is flexible and may be used to program one device to perform multiple logic function.

DRAWINGS

Detailed Description

Figure 1:
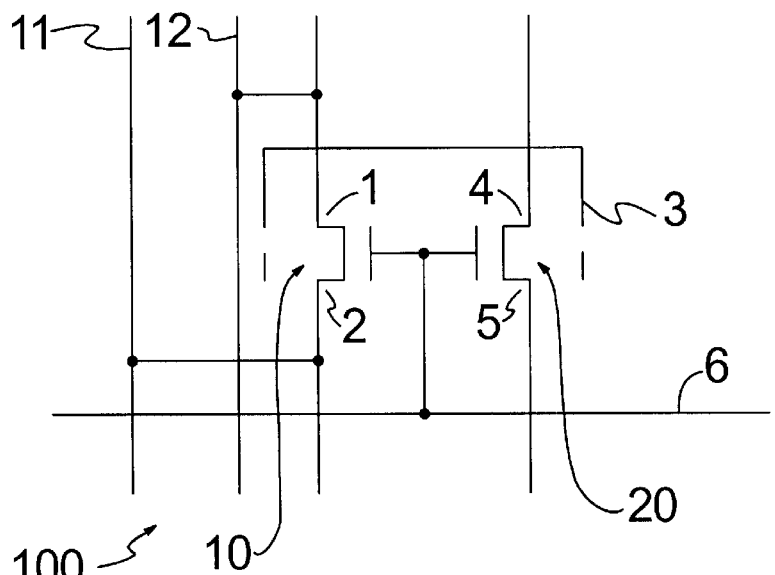
FIG. 1 is a schematic representation of the two transistor cell architecture of the invention.
Figure 2:
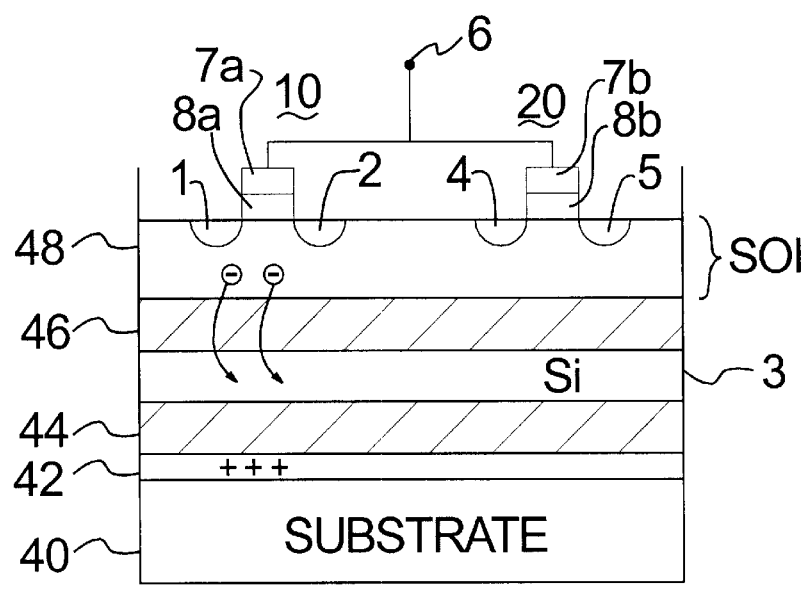
FIG. 2 is a cross section of a typical two transistor cell.

FIG. 1 shows a schematic circuit diagram of the cell 100 using a backplane structure that serves as a floating gate. FIG. 2 shows a cross sectional view of the cell 100. The cell is fabricated on a backplane silicon-on-insulator structure. A substrate 40 has a heavily doped upper surface 42. An oxide layer 44 covers the surface 42. A conductive backgate 3 is deposited on the oxide layer 44. The backgate 3 may be doped polysilicon or another suitable conductive material including metal, silicide or conductive monocrystalline silicon formed by epitaxial deposition of exfoliation. Backgate 3 is covered with an oxide layer 46. A device substrate 48 is grown or bonded to the surface 46 to provide a silicon-on insulator (SOI) device. The cell 100 and integrated circuits made therewith can be formed by any conventional SOI process, including and not limited to bonding and exfoliation. The device substrate 48 includes a cell 100 with transistors 10 and 20. Transistor 10 has a drain 1 and a source 2. Transistor 20 has a drain 4 and a source 5. A gate oxide layer 8 is patterned into individual gate insulators 8a, 8b. A conductive gate 7 layer is likewise patterned into gate 7a, 7b. The gates 7a, 7b are tied together by line 6 which may be doped polysilicon or metal, as suitable or desired.

The cell has two gates: a front gate 7 that is separated from the thin silicon-on-insulator channel by an oxide 8, and a second, a backgate 3 formed from a backplane and separated from the silicon channel and the substrate through an oxide 46. The backplane region 3 is a common between the two transistors 10, 20. The heavily doped region 42 underneath the backgate 3 allows the fields in transistor 10 to inject electrons into the floating gate backplane region. This requires current to flow between node 1 (e.g., a drain) and the node 2 (the source) due to a formation of channel using gate voltage. A lower energy backplane through the potential applied to the substrate doped region allows electron injection into the backplane. Thus the voltage potential on line 1, 2, and 6, and the doped region 42 of the substrate 40 programs the backplane. The injection of charge in the floating gate region changes the threshold voltage of the transistor 20. Thus, transistor 20's state of conduction is set by the programming of transistor 10 and transistor 20 can be set to be on or off depending on the programming of transistor 10.

It is noted that the charging in the back-floating gate structure requires bias that is conducive to electron injection into the underlying floating gate region. This can be accomplished by raising the channel higher in energy with respect to the substrate even when it is conducting. For example, a negative potential applied to source, a smaller negative potential applied to the drain, a zero or other potential applied to the top gate so that electrons are attracted to the channel, and a zero or positive potential applied to the substrate allows conduction to take place in both the top and bottom channel of the transistor, and allows hot electron and Fowler-Nordheim tunneling to occur to the underlying floating gate region. There are other schemes of applied potential that give rise to a similar injection. The absence of charge in the underlying floating gate leads to a low state of threshold voltage in an N-channel device, whereas the presence of charge leads to a higher state of threshold voltage for the transistor above.

The cell structure has a high density and consumes a small amount area compared to other programmable cell structures. The denseness of structure comprising cells 100 arises from the use of a cell structure with a common floating gate region and the burying of this floating gate region below the transistor channel. It allows the removal of a number of interconnections from the top of the transistor. At the same time, the layout also allows for a number of the common lines to be run in an extremely dense form.

Figure 3:
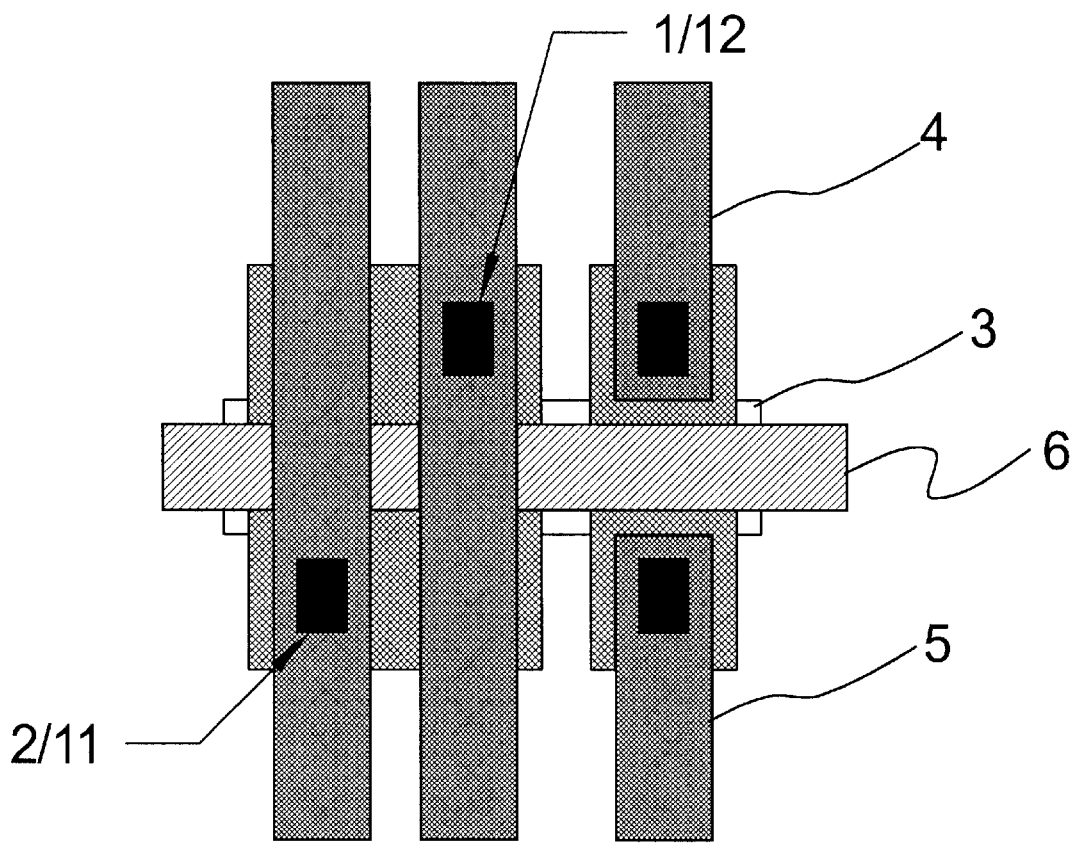
FIG. 3 is a plan view of the layout of the cell shown in FIGS. 1 and 2.
Figure 4A:
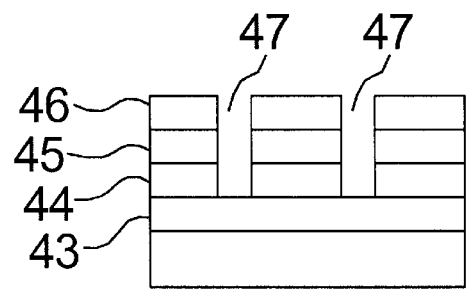
FIGS. 4A–4D are cross sections of devices made using one technique.
Figure 4C:
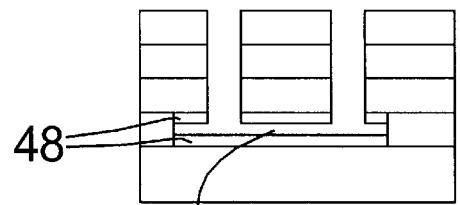
Figure 4B:
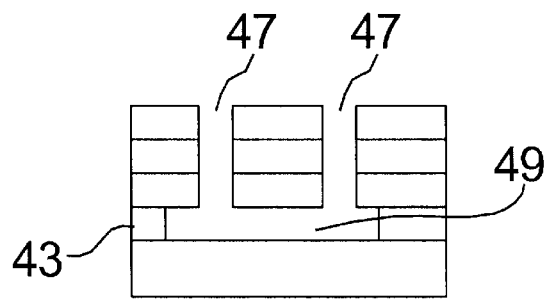
Figure 4D:
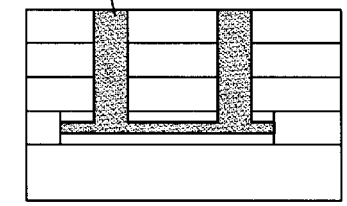

FIG. 3 shows a top layout of such a structure where the essential elements of isolation and layout of the programming lines have been incorporated. The line 12 extend over the source contacts 1 of each transistor 10 in each cell. The line 11 extends over the drain contacts 2 of the transistor 10. The line 6 ties the two gates 7a, 7b together. The backplane 3 is located beneath the channels of the transistors 10, 20 and above the substrate 40. The threshold voltage of transistor 20 is altered by charge stored in the backplane.

The fabrication of the structures uses standard silicon processing technology with a modified substrate consisting of the floating backplane that could be obtained through bonding techniques. Alternatively, the floating backplane could be introduced by a substitution process. A deeper trench isolation allows the placement of the floating backplane below the active region of the devices and their isolation from the other cell structures. Gates, oxides, ohmic contacts, vias, and interconnections are introduced using the conventional silicon processing technology.

The structure's compactness is readily apparent from FIG. 3. The density of the cell arises from the burying of the floating backplane region and the use of the compact cell design for programmability.

The invention links two transistors together beneath the surface of the sources and drains. One transistor is programmable to be either on or off. The other transistor may be part of a signal-carrying logic device. As such, the invention provides a programmable or configurable logic array. The two transistor cell in the array provides for a highly conpact and efficient layout. In effect, there is a buried interconnect that is embodied in the floating gate line. If that interconnect was above the transistors, the device would be significantly more complex and consume a substantially greater amount of real estate. The invention has a potential transistor density of $10^9$ devices/square centimeter. In addition, the backplane programmable logic structure fast enough to change functions during operation. As such, during some clock cycles the entire chip or a portion thereof could operate as one type of device and then switch device types during a different clock cycle. For example, an integrated circuit made with the inventive two transistor programmable buried backplane structure can operate as a graphics processor for several clock cycles and then as a microprocessor during other clock cycles. In addition, parts of the integrated circuit can be programmed to perform different functions. Layout is not a problem and the only complexity is designing the software to configure the array. As such, the invention makes it possible to produce a system on a chip since one can partition the different portions of the chip to perform different functions. Thus, some portions of the chip could perform arithmetic logic functions, while others could be simple memory functions. Still other portions could provide various system functions including an input/output interface and A to D converters.

A contact to the back plane allows easy implementation of double-gate transistors. Double gate transistors are viable alternative to conventional CMOS transistors due to their lower short-channel effect and higher current drive. Another benefit of the second gate is that it can modulate the threshold voltage of the transistor optimizing operation for either higher performance or lower-power consumption. The hot electrons injected into the floating gate/backplane can be modified to change the threshold of the programmed transistor. As such, different cells can be programmed to operate at different voltages. This feature is particularly useful in mixed signal devices where analog voltages are used as input or output or to operate or control digital circuits.

At present, design time stretches out as the density of the device increases. Debugging design defects can take a substantial amount of time. With this invention, design time is shortened since one does not have to redesign a circuit but merely program an array. Software can map any defects in a given array so that the defective cells are avoided. Likewise, redundant cells can be built into the array to replace any defects that develop over time. In addition, on the same chip you can set different threshold levels so that in effect you can have different power levels for different portions of the chip.

The invention can be made by a number of processes. Two examples of processes are described below.

One technique is based on undercutting the bond oxide layer of a silicon on insulator (SOI) wafer and filling it with doped polysilicon or conductive high affinity material. With reference to FIGS. 4A–4D, one starts with an SOI wafer 42 that has a bond oxide layer 43 for holding a device layer 44 of monocrystalline silicon. A thin protective oxide 45 is grown on layer 44 followed by deposition of low stress SI3N4 layer 46. The stack is patterned with a masking layer (not shown) to define trenches 47, which are etched to reach the bond oxide layer 43 of SOI wafer 42. BHF is then used to undercut the bond oxide layer 43 beneath the silicon-oxide-siliconnitride stack. An injection oxide 48 is then grown by thermal oxidation. A thicker back-control oxide as compared to injection oxide can be achieved by heavily doping the substrate before oxidation. Then the undercut region 49 is doped amorphous silicon 50 to define a the back gate structure. Undercuts 49 having lateral width as large as 5 micrometers are filled. The silicon 50 is then polished off by chemical-mechanical-polishing and followed with standard CMOS processing to make the transistors. The trenches also provide an external contact to the floating gate to make double gate transistors at no additional cost.

Figure 5A:
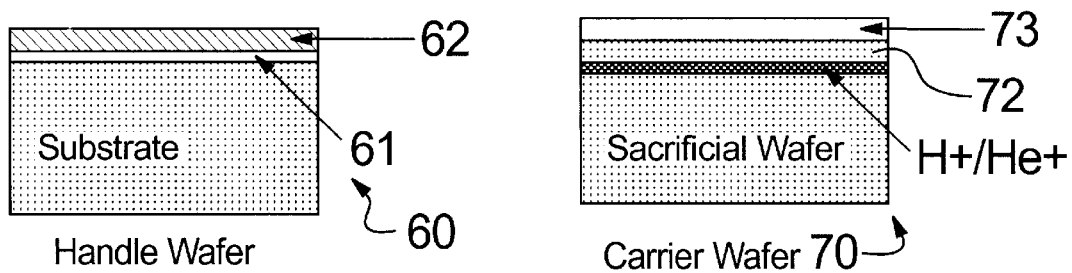
FIGS. 5A–5C are cross sections of devices made using another technique.
Figure 5B:
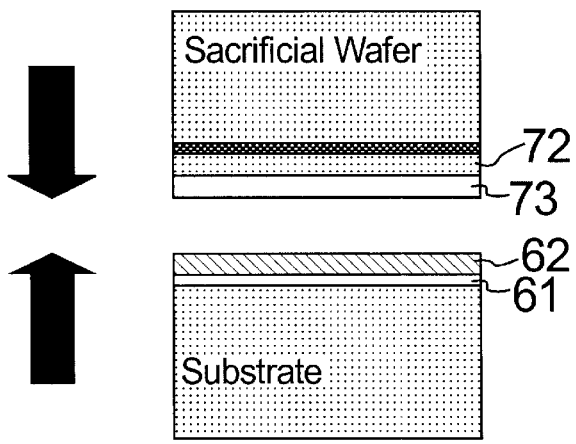
Figure 5C:
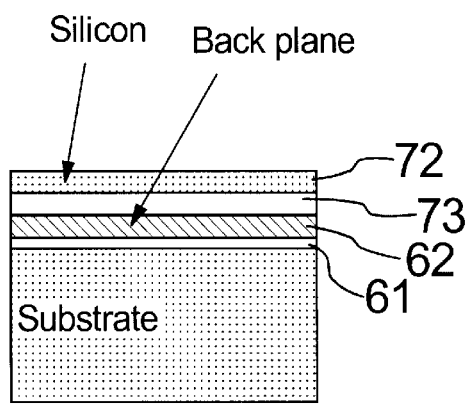

FIGS. 5A–5C provide an alternate technique. A handle wafer 60 has a back control oxide layer 61 that is covered with a layer of amorphous or polysilicon 62. The back control oxide is grown on a heavily doped n-substrate. Doped amorphous silicon 62 is then deposited which forms the floating gate in the end. A carrier wafer 70 has H+/He+ implanted at the appropriate range to define the transferred silicon 72. Injection oxide 73 is grown on the carrier wafer. The two wafers are then bonded and cleaved using the smart-cut technique described about to get silicon transferred from the carrier wafer.

In another embodiment of the present invention, the underlying floating gate region can be formed from a material having a larger electron affinity than silicon (e.g., as described in U.S. Pat. No. 5,508,543, incorporated herein by reference). For example, instead of silicon, W, TiN, WN, etc. may be used in the same operating conditions as discussed above for silicon. In such a case, electron injection into the floating gate results in a larger barrier for extraction, and hence thinner oxides to the back can be used (e.g., the thinner oxides having a thickness substantially within a range of about 1–5 nm), and a write operation becomes possible at lower voltages (e.g., voltages of substantially between about 0.5 and 5 V with use of the thinner oxides) with non-volatility still being maintained. It is also more immune to "read disturbs", and hence allows for easier multi-level operation.

Devices made with the invention can be electrically scanned for defects before the device is programmed. In that way programmers can disable nonfunctional cells and route signals to functional cells.

Thus, as described above, with the unique and unobvious structure and method of the present invention, a floating gate (e.g., a semiconductor or a metal) is buried under a thin transistor channel, with the charge on the floating gate determining the threshold voltage of the device. The injection oxide for the buried floating gate can be made larger (e.g., approximately within a range of 7–10 nm) while the oxide for the top gate can be scaled to smaller dimensions. By decoupling the oxide thickness of a floating gate from the scaling of the transistor, a device is achieved that can be scaled to significantly smaller dimensions than the conventional memory structures. Further, by allowing for larger coupling capacitance between the floating gate and the channel and doped region, more efficient transfer of electrons results, without affecting the ability to sense the transistor conduction using the top gate.

For example, such further modifications may be made as shown and suggested in the annexed Appendix, Three-Dimensional Integration with Buried Local Interconnects and Multi-Layer Three-Dimensional Planar and Low Power Silicon CMOS Technology whose entire content is incorporated by reference. The invention may be used for both planar and three dimensional structures that include programmable memory devices as well as programmable transistor with altered analog features. The programmed transistor can be programmed to have different threshold voltages, thereby adapting it for use in analog circuits, including and not limited to anolog-to-digital and digital-to-analog converters. The features of the invention enable one skilled in the art to form, on one substrate or in a three dimensional structure a computer system including logic, memory and analog inputs and outputs. Such systems include microprocessors, microcomputers and digital signal processors.

We claim:

1. A programmable logic integrated circuit with a plurality of programmable logic cells, wherein each programmable logic cell comprises:
   a support substrate covered with a first insulating layer and a backgate on the first insulating layer;
   a second insulating layer disposed over the backgate;
   a device substrate over the second insulating layer and comprising a semiconductor material with a first transistor and a second transistor and means for storing charge on the backgate for altering the threshold of said first transistor.

2. The programmable logic integrated circuit of claim 1 wherein the integrated circuit comprises logic cells or a combination of memory and logic cells wherein the memory cells also have a backgate in the device substrate for programming the memory cells.

3. The programmable logic integrated circuit of claim 1 wherein the logic cells are non-volatile and retain their respective state without external power.

4. The programmable logic integrated circuit of claim 1 wherein one or more cells may be programmed during operation of the integrated circuit.

5. The programmable logic integrated circuit of claim 1 scalable to dimensions sensitive for single electron sensitivity.

6. The programmable logic integrated circuit of claim 1 further comprising s plurality of surplus logic cells and means for reprogramming the integrated circuit to use one or more of the surplus logic cells when another logic cell or logic cells become defective or inoperative.

7. The programmable logic integrated circuit of claim 1 wherein the support substrate comprises semiconductor material and the has a heavily doped upper surface beneath the first insulating layer.

8. The programmable logic integrated circuit of claim 1 wherein the cells comprise first and second programming lines coupled to a plurality of programming transistors and a third programming line coupled to the gates of the two transistors of each cell, wherein the backgate extends beneath the respective channels of the transistors or each cell.

9. The programmable logic integrated circuit of claim 1 wherein one set of logic cells is programmed to perform a first logic function and one or more other set(s) of cells are programmed to perform other logic function(s).

10. A programmable integrated circuit with programmable analog transistors in programmable cells, wherein each programmable cell comprises:
    a support substrate covered with a first insulating layer and a backgate on the first insulating layer;
    a second insulating layer disposed over the backgate;
    a device substrate over the second insulating layer and comprising a semiconductor material with a first transistor and a second transistor, said second transistor having an analog signal input and an analog signal output and means for storing charge on the backgate for altering the threshold voltage of said first transistor to alter the analog signal output.

11. A programmable integrated circuit with programmable logic cells and programmable memory cells for forming a programmable computing device, wherein each programmable cell comprises:
    a support substrate covered with a first insulating layer and a backgate on the first insulating layer;
    a second insulating layer disposed over the backgate;
    a device substrate over the second insulating layer and comprising a semiconductor material with a first transistor and a second transistor, and means for storing charge on the backgate for altering the threshold voltage of said first transistor in the cell.

12. The programmable integrated circuit of claim 11 further comprising a second or more substrates for forming a three dimensional structure.

13. A programmable three dimensional structure comprising two or more substrates wherein at least one substrate has a programmable cell comprising a support substrate covered with a first insulating layer and a backgate on the first insulating layer;

a second insulating layer disposed over the backgate;

a device substrate over the second insulating layer and comprising a semiconductor material with a first transistor and a second transistor, and means for storing charge on the backgate for altering the threshold voltage of said first transistor in the cell.

* * * * *